United States Patent [19]

Munger et al.

[11] 4,210,712
[45] Jul. 1, 1980

[54] ADHESIVE-BEARING METAL SHEET WITH PHOTOPOLYMERIZABLE LAYER

[75] Inventors: Stanley H. Munger, Rumson; Herbert J. Pine, Edison, both of N.J.

[73] Assignee: E. I. Du Pont de Nemours and Company, Wilmington, Del.

[21] Appl. No.: 915,312

[22] Filed: Jun. 14, 1978

[51] Int. Cl.² ............................................. G03C 1/94
[52] U.S. Cl. .................................. 430/275; 428/329; 428/333; 428/331; 428/344; 428/356; 428/461; 430/276; 430/278; 260/29.6 RB
[58] Field of Search ............... 428/331, 333, 339, 329, 428/344, 356, 421, 461, 520, 522; 96/36.3, 35.1, 86 P; 260/29.6

[56] References Cited

U.S. PATENT DOCUMENTS

| | | | |
|---|---|---|---|
| 3,440,047 | 4/1969 | Levinos et al. | 96/36.3 |
| 3,718,500 | 2/1973 | Nyquist | 428/461 X |
| 3,953,309 | 4/1976 | Gilano et al. | 428/461 X |

FOREIGN PATENT DOCUMENTS 621247  5/1961  Canada .

Primary Examiner—George F. Lesmes
Assistant Examiner—E. Rollins Buffalow

[57] ABSTRACT

Adhesive coated metal sheet, e.g., steel, aluminum, bearing an adhesive layer comprising an ethyl acrylate, methyl methacrylate and acrylic acid copolymer; styrene and maleate ester copolymer, aqueous colloidal silica, and aqueous latex of a self-curing interpolymer. Pigments, e.g., ferric oxide, and antifoaming compounds can be present in the adhesive layer which is useful in adhering aqueous soluble photopolymerizable layers to the support. The elements formed are useful for printing.

7 Claims, No Drawings

ADHESIVE-BEARING METAL SHEET WITH PHOTOPOLYMERIZABLE LAYER

TECHNICAL FIELD

This invention relates to metal sheets coated with an adhesive layer and more particularly to adhesive coated metal sheets bearing a layer of a photopolymerizable composition.

BACKGROUND ART

Photopolymerizable printing plates are well-known to those skilled in the printing arts. In recent years such plates have become useful in all areas of printing including: letterpress, pattern plates, flexographic, etc. There have been many problems associated with the research and development of the photopolymerizable printing plates which have a base support, e.g., metal, bearing a photopolymerizable layer. Such plates, during printing, undergo pressures and stresses which can be destructive of the printing images. Since photopolymerizable layers normally do not adhere to the support under the printing conditions to which the printing plate is exposed, early in the development of such printing plates adhesive layers were inserted between the support and the photopolymerizable layer. During development, e.g., with solvent washout, it was found that the adhesive layer was often attacked by the solvent thereby weakening the bond. Printing plates were developed that contained so called "barrier layers", i.e., a thin portion of the photopolymerizable layer adjacent to the support was completely polymerized thereby preventing solvent from affecting the adhesive bond. While the barrier layer proved to be effective, it is advantageous because an additional step is required to form the barrier layer and the image, after development, is of decreased height because of the presence of the barrier layer. It is therefore desirable to utilize as an adhesive layer a composition that satisfactorily adheres the photopolymerizable layer to the support prior to and after development without the presence of a barrier layer. Advantageously the adhesive layer is developable in the same aqueous alkaline solution as is the photopolymerizable layer.

DISCLOSURE OF INVENTION

In accordance with this invention there is provided an adhesive coated metal sheet bearing a layer of an adhesive composition which comprises (a) a copolymer of ethyl acrylate, methyl methacrylate and acrylic acid, 17 to 98 parts by weight;

(b) a copolymer of styrene and a maleate ester taken from the group of secondary butyl maleate and isobutyl maleate, 1.7 to 67 parts by weight;

(c) aqueous colloidal silica, 1.4–11.7 parts by weight, and (d) an aqueous acrylic latex of a selfcuring interpolymer of (1) from 90 to 99.9% by weight of at least one ester having the structure

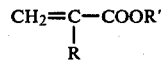

wherein R is a member of the class consisting of hydrogen, an alkyl radical having from 1 to 4 carbon atoms, a halogen and a cyano group and R' represents an alkyl radical having from 1 to 4 carbon atoms, (2) from 0 to 5% by weight of an alpha,beta-monoolefinically unsaturated nitrile, (3) from about 0.1 to 5% by weight of an alpha, beta-olefinically unsaturated monocarboxylic acid and (4) from about 0 to 5% by weight of an N-alkylol amide of an alpha,beta-olefinically unsaturated carboxylic acid having from 4 to 10 carbon atoms, 2 to 7.5 parts by weight.

Photopolymerizable compositions utilized in this invention are known compositions bonded to metal sheet supports, e.g., steel, tin-plated steel, aluminum, chromate-treated aluminum, copper plated aluminum, etc. The supports generally have a thickness in the range of 1.0 to 100 mils (0.0025 to 0.25 cm). Preferred photopolymerizable compositions are those acrylic or vinyl homopolymers or copolymers as described in Leberzammer et al U.S. Ser. No. 654,171, filed Jan. 30, 1976 and Belgian Pat. No. 828,237 which have a binder system compatible with that of the adhesive. These compositions are film-forming and the layers are soluble in their unexposed state in dilute aqueous alkaline solutions devoid or organic solvents. The photopolymerizable layers are in the thickness range of 10 to 50 mils (0.025 to 0.125 cm). Other useful acrylic type photopolymerizable compositions are disclosed in Canadian Pat. No. 621,247.

Between the metal support and the photopolymerizable layer is an adhesive composition having at least four components as described above. Component (a) is a copolymer of ethyl acrylate, methyl methacrylate and acrylic acid present in 17 to 98 parts by weight. A preferred copolymer contains ethyl acrylate (56)/methyl methacrylate (37) and acrylic acid (7).

Components (b) is a copolymer of styrene and a maleate ester taken from at least one of secondary butyl maleate and isobutyl maleate, 1.7 to 67 parts by weight.

Component (c) is aqueous colloidal silica, 1.4 to 11.7 parts by weight. A preferred colloidal silica is 40% by weight solids in ammonia but other aqueous colloidal silica formulations can be used.

Component (d) is an aqueous acrylic latex of a self-curing interpolymer of (1) from 90 to 99.9% by weight of at least one ester having the structure

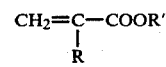

wherein R is a member of the class consisting of hydrogen, an alkyl radical having from 1 to 4 carbon atoms, a halogen and a cyano group and R' represents an alkyl radical having from 1 to 4 carbon atoms, (2) from 0 to 5% by weight of an alpha,beta-monoolefinically unsaturated nitrile, (3) from about 0.1 to 5% by weight of an alpha,beta-olefinically unsaturated monocarboxylic acid and (4) from about 0 to 5% by weight of an N-alkylol amide of an alpha,beta-olefinically unsaturated carboxylic acid having from 4 to 10 carbon atoms, 2.0 to 7.5 parts by weight. Preferably the interpolymer is an acrylic latex (acidic) emulsion type (e.g., 50% solids) having a specific gravity of 1.07, pH of 3.0, glass transition temperature of about $-11°$ C. and contains 90% by weight ethyl acrylate, less than 10% acrylonitrile and less than 5% by weight of a reactive heat-functional crosslinkable amide type monomer. Other useful latex emulsion type compounds include those having glass transition temperatures of from $-20°$ C. to $+8°$ C. Also useful as acrylic latex compounds are polyethyl acrylate having a glass transition temperature of $-22°$ C.; polychloroprene/methacrylic acid stabilized with polyvinyl alcohol (90/10) and polychloroprene/methacrylic acid (90/10) stabilized with polyvinyl alcohol (100)/zinc oxide (5)/4-methyl-6-t-butyl phenol (2).

In addition to the above-required four components, the adhesive composition can contain (e) pigments which provide effective antihalation protection in the photopolymerizable element, up to 7.0 parts by weight and (f) antifoaming compounds, in an amount of up to 1.0 part by weight, preferably nonionic fluorosurfactant compounds. The antifoaming compound is present as a coating aid. Suitable pigments include: iron oxide dispersions such as Inmont RBH-991 B043 Brown and RBH-991 B008 Red; other dyes and pigments such as: 4,4'-methenyl-bis-(1-p-sulfo-phenyl)-3-methylpyrazolone-5), Pontamine ® Fast Orange W/S CI Direct Orange 102, Stilbene ® Yellow GXG Liquid CI Direct Yellow 11, Pontamine ® Fast Turquoise 8GL CI Direct Blue 86, Pontamine ® Fast Orange 6RN CI Direct Orange 15, Du Pont's Pontamine ® Fast Yellow NNL, Pontamine ® Brillant Yellow 5GA Liquid, Green Pontamine ® 2B, etc. Suitable antifoaming compounds include:

$F(CF_2CF_2)_{3-8} CH_2CH_2O(CH_2CH_2O)_{11.5}H$,
Monflur ® 31 and 53 Fluorosurfactant, ICI,
Tetronic ® 1101 and 1501 ethylene diamine block copolymer, BASF,
Pluracol ® P1010 and P-2010 propylene oxide in propylene glycol nucleous, BASF,
Pluracol ® OP-200 oleic acid propylene oxide adduct, BASF,
Pluracol ® 31R$_1$ and 31R$_2$, BASF
Antifoam ® 60, General Electric,
Antifoam ® SF 69 and SF 1141, General Electric.

The photopolymerizable elements are generally prepared as described in the examples below. The adhesive compositions are thoroughly mixed in standard mixing apparatus and then coated on the metal support of the type described above. While not being limited, a wire rod coating apparatus is useful, e.g., a wire 8 mils (0.20 mm) or more in diameter. Coaters of this type can be obtained from Consler Corp., Honeyoe Falls, New York and Paul M. Gardner Company, Fort Lauderdale, Florida. The adhesive layer formed is then cured in the range of 180° to 225° C. for up to 4 minutes and the adhesive coated supports are press laminated with a photopolymerizable layer of the desired thickness at a temperature in the range of 130° to 150° C. for up to 5 minutes. Preferred curing and laminated conditions are 200° C. for 2 minutes and 140° C. for 5 minutes, respectively. However, if the temperatures are increased the amount of time will be decreased.

To determine the adequacy of the adhesive bond tests have been developed to determine adhesion both prior to exposure (before processed adhesion) and after development (processed adhesion). The tests used in the examples are described more fully as follows:

Before Processed Adhesion Test

A sample of the adhesive coated metal support is press laminated against a layer of photopolymerizable composition, 30 mils (0.76 mm) thick, in a mold 6 inches by 9 inches (15.24 cm×22.86 cm) for 5 minutes at 140° C. and is cooled under pressure. A strip of the photopolymer layer is peeled apart by hand and the "before processed adhesion" is qualitatively judged by resistance to delamination:

Poor is easily delaminated.
Fair - Poor is slight resistance to peel (tacky).
Fair is good resistance to delamination.
Good is significant resistance to delamination.
V good is very significant resistance to delamination.
Excellent is polymer breaks on rapid peeling.
Excellent + is polymer breaks without peeling.

Processed Adhesion Test

Two plates, 11.75 inches by 1.5 inches (29.84 cm by 3.81 cm), are cut. They are photoconditioned using actinic radiation (polyvinyl chloride and polyvinyl fluoride filter) to two-thirds of the minimum exposure to polymerize the plates using a diamond test negative. After processing the plate is rapidly bent to a 90 degree angle at a diamond image. The maximum delamination (mm) is measured, the lower the value the better the adhesion. Qualitatively the following codes were developed by attempting to break the relief image and correlating the relative resistance to delamination.

Fair - Good is slight resistance to peel (tacky).
Good is significant resistance to delamination.
V. good is very significant resistance to delamination.
Good - Excellent is polymer breaks on peeling.
Excellent is polymer breaks, negligible delamination.
Excellent + is polymer breaks without any delamination.
Excellent + + is delamination within the polymer.

Best Mode for Carrying Out the Invention

The best mode is illustrated in Example 4 wherein an aqueous six component adhesive composition having a viscosity of 100 cps at 21° C. is prepared. The adhesive is coated to a wet thickness of 0.2 mil (0.0005 cm) on an aluminum support, 11.5 mils (0.029 cm) in thickness. The adhesive is cured at 204°–215° C. for 1 minute and a 30 mil (0.076 cm) thick photopolymerizable layer (Mixture 2 of Example 4) is press laminated to the cured adhesive-coated sheet. An excellent processed adhesion test result is achieved after development in dilute aqueous alkaline solution.

Industrial Applicability

The adhesive coated supports bearing the photopolymerizable layers are useful for relief or letterpress, pattern plates, flexographic, etc. printing plates. The reliefs adhere in excellent manner to the support both before and after the elements formed are exposed and developed. Development in dilute alkaline solution not only removes the unexposed image areas of the photopolymerizable layer, but the corresponding areas of the underlying adhesive layer down to the support. The printing plate achieved is not only of improved quality but requires no barrier layer and therefore provides greater height of the relief. The printing plate is produced by an ecologically sound method.

EXAMPLES

The invention is illustrated by the following examples wherein the parts are percentages are by weight.

EXAMPLE 1

|  | Parts | | |
| --- | --- | --- | --- |
|  | (1) | (2) | (3) |
| Ethyl acrylate/methyl methacrylate/acrylic acid (56/37/7) (11.0% solution) (Mol. Wt. 260,000) | 92.86 | 94.77 | 89.24 |
| Styrene/sec. butyl maleate (1.4/1) (11% | | | |

|  | Parts | | |
| --- | --- | --- | --- |
|  | (1) | (2) | (3) |
| solution) (Mol. Wt. 10,000) | 3.81 | 1.90 | 4.76 |
| Aqueous colloidal silica sol stabilized with ammonia (40% solids) | 1.43 | 1.43 | 2.19 |
| Acrylic elastomeric latex (50% solids) Spec Gr 1.07, pH 3.0, Tg about −11° C. (90% ethyl acrylate, <10% acrylonitrile and <5.0% of a reactive, heat-functional crosslinkable amide type monomer). | 1.90 | 1.90 | 3.81 |

Adhesive compositions (1) and (2) were coated on tin-plated steel having a thickness of 0.1 mil (0.00025 cm) and adhesive composition (3) was coated on 10–12 mils (0.025–0.031 cm) thick bare aluminum using a #8 wire wound rod to give 0.1 mil (0.00025 cm) thick layers. The adhesive compositions were cured at 392° F. (200° C.) for 2 minutes. The plates were press-laminated at 140° C. for 5 minutes to a 30 mils (0.0762 cm) photopolymer sheet having the following composition:

|  | Parts |
| --- | --- |
| Styrene/isobutyl maleate (1.4/1) (Mol. Wt. 20,000) | 51.27 |
| Polyvinyl pyrrolidone/vinyl acetate (60/40) | 7.5 |
| Triethylene glycol diacrylate | 22.1 |
| Butyl benzyl phthalate | 19.0 |
| Ethyl anthraquinone | 0.1 |
| [1,4,4]-trimethyl-2,3-diazobicyclo [3,2,2] non-2-ene N,N′-dioxide | 0.03 |

The photopolymer plates were tested for processed adhesion using the procedure described above to give the following results:

| Plates | (1) | (2) | (3) |
| --- | --- | --- | --- |
| Adhesion (mm) | 10 | 6 | 3 |

EXAMPLE 2

Aqueous adhesive composition was prepared by thoroughly mixing the following ingredients:

|  | Parts |
| --- | --- |
| Ethyl acrylate/methyl methacrylate/acrylic acid copolymer described in Ex. 1 (12.0% solution) | 63.2 |
| Styrene/sec. butyl maleate copolymer described in Ex. 1. | 20.9 |
| Colloidal silica described in Ex. 1. | 10.7 |
| Acrylic Elastomeric Latex described in Ex. 1. | 5.2 |

The above composition having a viscosity of 100 cps was coated on 12 mils (0.031 cm) thick chromate-treated aluminum using a #8 wire wound rod to give a 0.1 mil (0.00025 cm) thick layer. The adhesive composition was cured at 392° F. (200° C.) for 2 minutes. The plate was press laminated as in Ex. 1 with a 30 mil (0.076 cm) photopolymer sheet having the following composition.

|  | Parts |
| --- | --- |
| Styrene/sec. butyl maleate described above | 52.7 |
| Polyvinyl pyrrolidone/vinyl acetate described in Ex. 1. | 7.5 |
| Triethylene glycol diacrylate | 20.9 |
| Butyl benzyl phthalate | 18.8 |
| Ethyl anthraquinone | 0.10 |
| [1,4,4]-trimethyl-2,3-diazobicyclo [3,2,2] non-2-ene N,N′-dioxide | 0.03 |

The dried plate was tested for adhesion as described above to give a processed adhesion measurement of 1–2 mm.

Another chromate treated aluminum substrate, 10 mils (0.0254 cm) thick coated with the photosensitive composition described above gave a processed adhesion measurement of 19.3 mm. (Control)

EXAMPLE 3

Four aqueous adhesive compositions were prepared by thoroughly mixing the following ingredients:

|  | Parts | | | |
| --- | --- | --- | --- | --- |
|  | 1 | 2 | 3 | 4 |
| Ethyl acrylate/methyl methacrylate/acrylic acid copolymer described in Ex. 1. | 62.7 | → | → | → |
| Styrene/sec. butyl maleate copolymer described in Ex. 1. | 20.9 | → | → | → |
| Colloidal silica described in Ex. 1. | 10.7 | → | → | → |
| Acrylic Elastomeric latex described in Ex. 1 | 5.2 | — | — | — |
| Acrylic Elastomer latex similar to that of Example 1 to provide Tg-20° C. | — | 5.2 | — | — |
| Polychloroprene/methacrylic acid (90/10) stabilized with polyvinyl alcohol | — | — | 5.2 | — |
| (Polychloroprene/methacrylic acid stabilized with polyvinyl alcohol (100),/ Zinc Oxide (5) /4-methyl-6-t-butyl phenol (2) | — | — | — | 5.2 |

The above compositions were coated on 10–12 mils (0.025–0.031 cm) thick bare aluminum substrate using a #8 wire wound rod to give a 0.1 mil (0.00025 cm) thick layer. The adhesive was cured at 392° F. (200° C.) for 2 minutes. The plates were then press laminated at 140° C. for 5 minutes to a 30 mils (0.0762 cm) thick photopolymer sheet having the following composition:

|  | Parts |
| --- | --- |
| Styrene/isobutyl maleate described in Ex. 1. | 54.47 |
| Polyvinyl pyrrolidone/vinyl acetate described in Ex 1 | 7.40 |
| Triethylene glycol diacrylate | 20.00 |
| Butyl benzyl phthalate | 18.00 |
| [1,4,4]-trimethyl-2,3-diazobicyclo [3,2,2] non-2-ene N,N′ dioxide | 0.03 |
| Ethyl anthraquinone | 0.10 |

The plates were tested for before processed and processed adhesion using the procedure described earlier.

| Plate | 1 | 2 |
|---|---|---|
| Before Processed Adhesion | V. Good | V. Good |
| Processed Adhesion | Excellent | V. Good–Excellent |
| | 3 | 4 |
| Before Processed Adhesion | Good | Good + |
| Processed Adhesion | V. Good | V. Good |

EXAMPLE 4

An aqueous adhesive composition was prepared by thoroughly mixing the following ingredients:

| | Parts |
|---|---|
| Ethyl acrylate/methyl methacrylate/acrylic acid copolymer described in Ex. 1 (14.5% solution) | 52.5 |
| Styrene/sec. butyl maleate copolymer described in Ex. 1. | 31.1 |
| Colloidal silica described in Ex. 1. | 7.4 |
| Acrylic Elastomeric Latex described in Ex. 1. | 7.4 |
| Iron Oxide (50.5% dispersion) | 1.4 |
| $F(CF_2CF_2)_{3-8}CH_2CH_2O(CH_2CH_2O)_{11.5}H$ (40% solution water, isopropanol) | 0.2 |

The adhesive composition having a viscosity of 100 cps at 70° F. (21° C.) was divided into 3 parts. One part was coated on 10 mils (0.025 cm) thick bare aluminum (Plate 1), a second on 11.5 mils (0.029 cm) thick bare aluminum (Plate 2), and a third on 8.8 mils (0.022 cm) thick cold rolled steel (Black plate) (Plate 3) using a reverse roll coater to give a wet film thickness of 0.2 mil (0.0005 cm). The adhesive composition on 10 mils (0.025 cm) and 11.5 mils (0.029 cm) thick aluminum was cured at 400°–420° F. (204°–215° C.) for 1 minute while the adhesive on the 8.8 mils (0.022 cm) thick cold rolled steel was cured at 410°–420° F. (210°–215° C.) for 40 seconds. Plates 1 and 3 were then press-laminated to a photopolymer sheet prepared from Mixture 1 and Plate 2 was press-laminated to photopolymer sheet, 30 mils (0.0762 cm) in thickness, prepared from Mixture 2 as described in this Example.

| | Parts | |
|---|---|---|
| | Mixture 1 | Mixture 2 |
| Styrene/isobutyl maleate described in Ex. 1. | 64.77 | 56.55 |
| Polyvinyl pyrrolidone/vinyl acetate described in Ex. 1. | — | 6.5 |
| Butyl benzyl phthalate | 13.0 | 15.0 |
| Triethylene glycol diacrylate | — | 21.0 |
| 1,6-Hexanediol diacrylate | 19.0 | — |
| 2,6 Di-tert. butyl-4-methyl phenol | 0.2 | 0.7 |
| Ethyl anthraquinone | — | 0.15 |
| [1,4,4] -trimethyl-2,3-diazobicyclo-[3,2,2] non-2-ene N,N'-dioxide | 0.03 | 0.03 |
| Tributoxyethyl phosphate | 1.0 | — |
| Basic Blue 7 dye | 0.0015 | 0.001 |
| Benzoin Isopropyl ether | 2.0 | — |

The plates were tested for adhesion as described above to give the following results:

| | Plates | | |
|---|---|---|---|
| | 1 | 2 | 3 |
| Processed adhesion (mm) | 2mm | 2mm | 2mm |

EXAMPLE 5

Two aqueous adhesive compositions were prepared by thoroughly mixing the following ingredients:

| | Parts | |
|---|---|---|
| | 1 | 2 |
| Ethyl acrylate/methyl methacrylate/acrylic acid copolymer described in Ex. 1. | 57.35 | 62.7 |
| Styrene/sec. butyl maleate copolymer described in Ex. 1. | 30.47 | 20.9 |
| Colloidal silica described in Ex. 1. | 6.09 | 10.7 |
| Acrylic Elastomeric Latex described in Ex. 1. | 6.09 | 5.2 |

Adhesive composition 1 having a viscosity of approximately 100 cps was coated on a 10–12 mils (0.025–0.031 cm) thick bare aluminum substrate using a #8 wire wound rod to give a 0.1 mil (0.00025 cm) thick layer. The adhesive was then cured at 392° F. (200° C.) for 2 minutes. The plate was then press laminated to a 30 mils (0.0762 cm) thick photopolymer sheet described in Ex. 3 at 140° C. for 5 minutes. The plate was tested for before processed and processed adhesion as described above with the following results:

Before Processed Adhesion Excellent V. Good
Processed Adhesion Excellent + + Excellent +

Four samples of adhesive composition 2 having a viscosity of 100 cps was coated on 10–12 mils (0.025–0.031 cm) thick bare aluminum substrates using a #8 wire wound rod to give a 0.1 mil (0.00025 cm) thick layer. The adhesive was cured at 392° F. (200° C.) for 2 minutes. The plates were press laminated to a 30 mil (0.0762 cm) photopolymer sheet having the following composition:

| | Parts |
|---|---|
| Styrene/isobutyl maleate described in Ex. 1. | 52.97 |
| Polyvinyl pyrrolidone/vinyl acetate described in Ex. 1. | 7.50 |
| Triethylene glycol diacrylate | 20.40 |
| Butyl benzyl phthalate | 19.00 |
| Ethyl anthraquinone | 0.10 |
| [1,4,4] -trimethyl-2,3-diazobicyclo [3,2,2] non-2-ene N,N'-dioxide | 0.03 |

The plates were then aged for 1 month and tested for before processed and processed adhesion with the following results:

| Aging Conditions | Adhesion | |
|---|---|---|
| | Before Processed | Processed |
| Ambient | Excellent | Fair-Good |
| 40° C. | Good | Good-Excellent |
| 66% Relative Humidity/70° F. (21° C.) | Excellent | — |

-continued

| Aging Conditions | Adhesion | |
|---|---|---|
| | Before Processed | Processed |
| 10% Relative Humidity/70° F. 21° C.) | Excellent + | Excellent + |

EXAMPLE 6

An aqueous adhesive composition was prepared by thoroughly mixing the following ingredients:

| | Parts | | |
|---|---|---|---|
| | 1 | 2 | 3 |
| Ethyl acrylate/methyl methacrylate/acrylic acid copolymer described in Ex. 1. | 62.7 | → | → |
| Styrene/sec. butyl maleate copolymer described in Ex. 1. | 20.9 | → | → |
| Colloidal Silica described in Ex. 1. | 10.7 | → | → |
| Acrylic Elastomer latex described in Ex. 1. | 5.2 | → | → |
| 5% Solution of 1,4-Diamino anthraquinone | — | 2.0 ml | — |
| 4,4'-methenyl-bis-(1-(p-sulfophenyl)-3-methyl-pyrazolone-5) | — | — | 0.4 |

The adhesive compositions having a viscosity of 100 cps at 75° F. (24° C.) were coated on 10–12 mils (0.025–0.031 cm) thick bare aluminum substrates using a #8 wire wound rod. The adhesives were then cured at 392° F. (200° C.) for 2 minutes. The plates were press laminated as in Example 3 to a 30 mils (0.0762 cm) photopolymer sheet disclosed in Ex. 3. The plates were then tested for before processed and processed adhesion by the procedure described above with the following results:

| Plates | 1 | 2 | 3 |
|---|---|---|---|
| Before Processed Adhesion | V. Good | V. Good | V. Good |
| Processed Adhesion | V. Good | V. Good-Excellent | V. Good |

We claim:

1. A metal sheet bearing a layer of an adhesive composition consisting essentially of
   (a) A copolymer of ethyl acrylate, methyl methacrylate and acrylic acid, 17 to 98 parts by weight;
   (b) a copolymer of styrene and a maleate ester taken from the group of secondary butyl maleate and isobutyl maleate, 1.7 to 67 parts by weight.
   (c) aqueous colloidal silica, 1.4 to 11.7 parts by weight; and
   (d) an aqueous acrylic latex of a self-curing interpolymer of (1) from 90 to 99.9% by weight of at least one ester having the structure

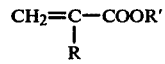

wherein R is a member of the class consisting of hydrogen, an alkyl radical having from 1 to 4 carbon atoms, a halogen and a cyano group and R' represents an alkyl radical having from 1 to 4 carbon atoms, (2) from 0 to 5% by weight of an alpha,beta-monoolefinically unsaturated nitrile, (3) from about 0.1 to 5% by weight of an alpha,beta-olefinically unsaturated monocarboxylic acid and (4) from about 0 to 5% by weight of an N-alkylol amide of an alpha,beta-olefinically unsaturated carboxylic acid having from 4 to 10 carbon atoms, 2 to 7.5 parts by weight;
   (e) a pigment, 0 to 7.0 parts by weight; and
   (f) an antifoaming compound, 0 to 1.0 part by weight, the adhesive bearing metal sheet adhered to an aqueous soluble photopolymerizable layer.

2. An adhesive coated metal sheet according to claim 1 wherein the pigment is ferric oxide.

3. An adhesive coated metal sheet according to claim 1 wherein the antifoam compound is a nonionic fluorosurfactant compound.

4. An adhesive coated metal sheet according to claim 1 wherein the metal sheet is taken from the group of steel, tin-plated steel, aluminum and chromate-treated aluminum.

5. An adhesive coated metal sheet according to claim 1 wherein the photopolymerizable layer is a layer, 10 to 50 mils in thickness of an photopolymerizable composition comprising an addition polymerizable ethylenically unsaturated monomer, a photoinitiator or photoinitiator system and at least one aqueous soluble polymeric binder.

6. An adhesive coated metal sheet according to claim 5 wherein a binder of the photopolymerizable composition is a copolymer of styrene and a maleate ester taken from the group of secondary butyl maleate and isobutyl maleate.

7. An adhesive coated metal sheet according to claim 5 wherein a binder of the photopolymerizable composition is an acrylic or vinyl homopolymer or copolymer.

* * * * *